(12) United States Patent
Yueh et al.

(10) Patent No.: US 7,147,985 B2
(45) Date of Patent: Dec. 12, 2006

(54) RESIST COMPOUNDS INCLUDING ACID LABILE GROUPS HAVING HYDROPHILIC GROUPS ATTACHED THERETO

(75) Inventors: Wang Yueh, Portland, OR (US); Ernisse S. Putna, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/815,398

(22) Filed: Mar. 31, 2004

(65) Prior Publication Data

US 2005/0221217 A1   Oct. 6, 2005

(51) Int. Cl.
| G03C 1/73 | (2006.01) |
| G03F 7/039 | (2006.01) |
| G03F 7/20 | (2006.01) |
| G03F 7/30 | (2006.01) |
| C08F 28/02 | (2006.01) |

(52) U.S. Cl. .................. 430/270.1; 430/326; 430/330; 430/905; 430/910; 526/286

(58) Field of Classification Search ............. 430/270.1, 430/905, 910, 325, 326
See application file for complete search history.

(56) References Cited

U.S. PATENT DOCUMENTS

| 6,280,897 | B1 * | 8/2001 | Asakawa et al. ........ 430/270.1 |
| 6,294,309 | B1 | 9/2001 | Chang et al. |
| 6,593,056 | B1 | 7/2003 | Takeda et al. |
| 6,632,581 | B1 | 10/2003 | Uetani et al. |
| 6,673,516 | B1 | 1/2004 | Kumon et al. |
| 2005/0147915 | A1 * | 7/2005 | Dammel .................. 430/270.1 |

FOREIGN PATENT DOCUMENTS

| EP | 1 085 379 A1 * | 3/2001 |
| EP | 1 199 603 | 4/2002 |

OTHER PUBLICATIONS

Takechi, Satoshi, et al., "Impact of 2-Methyl-2-Adamantyl Group Used for 193-nm Single Layer Resist", Journal of Photopolymer Science and Technology, vol. 9, No. 3 (1996) pp. 475-488.
Koji Nozaki, et al. and Akiko Kotachi et al., "A Novel Polymer for A 193-nm Resist", Journal of Photopolymer Science and Technology, vol. 9, No. 3 (1996) pp. 509-522.

* cited by examiner

Primary Examiner—Sin Lee
(74) Attorney, Agent, or Firm—Blakely, Sokoloff, Taylor & Zafman LLP

(57) ABSTRACT

A compound including a polymeric chain, an acid labile group attached to the polymeric chain, and at least one hydrophilic group attached to the acid labile group is disclosed. Compositions including the compound, and methods of using the compositions are also disclosed.

18 Claims, 1 Drawing Sheet

RESIST COMPOUNDS INCLUDING ACID LABILE GROUPS HAVING HYDROPHILIC GROUPS ATTACHED THERETO

BACKGROUND

1. Field

Embodiments of the invention relate to resist compounds including acid labile groups having hydrophilic groups attached thereto, compositions including the compounds, and methods of using the compositions.

2. Background Information

A potential problem with many positive-type chemically amplified resists based on a deprotection imaging mechanism is that the detached deprotection groups generally tend to be hydrophobic, and tend to have a low affinity toward water. As a result, it may be difficult to sufficiently dissolve the detached deprotection groups in aqueous developer solutions. At least a portion of the non-dissolved deprotection groups may tend to remain on the substrate after development as particles, scum, residues, or other remnants. These remnants may potentially contribute to defects and decreased manufacturing yields.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

Figure 1:
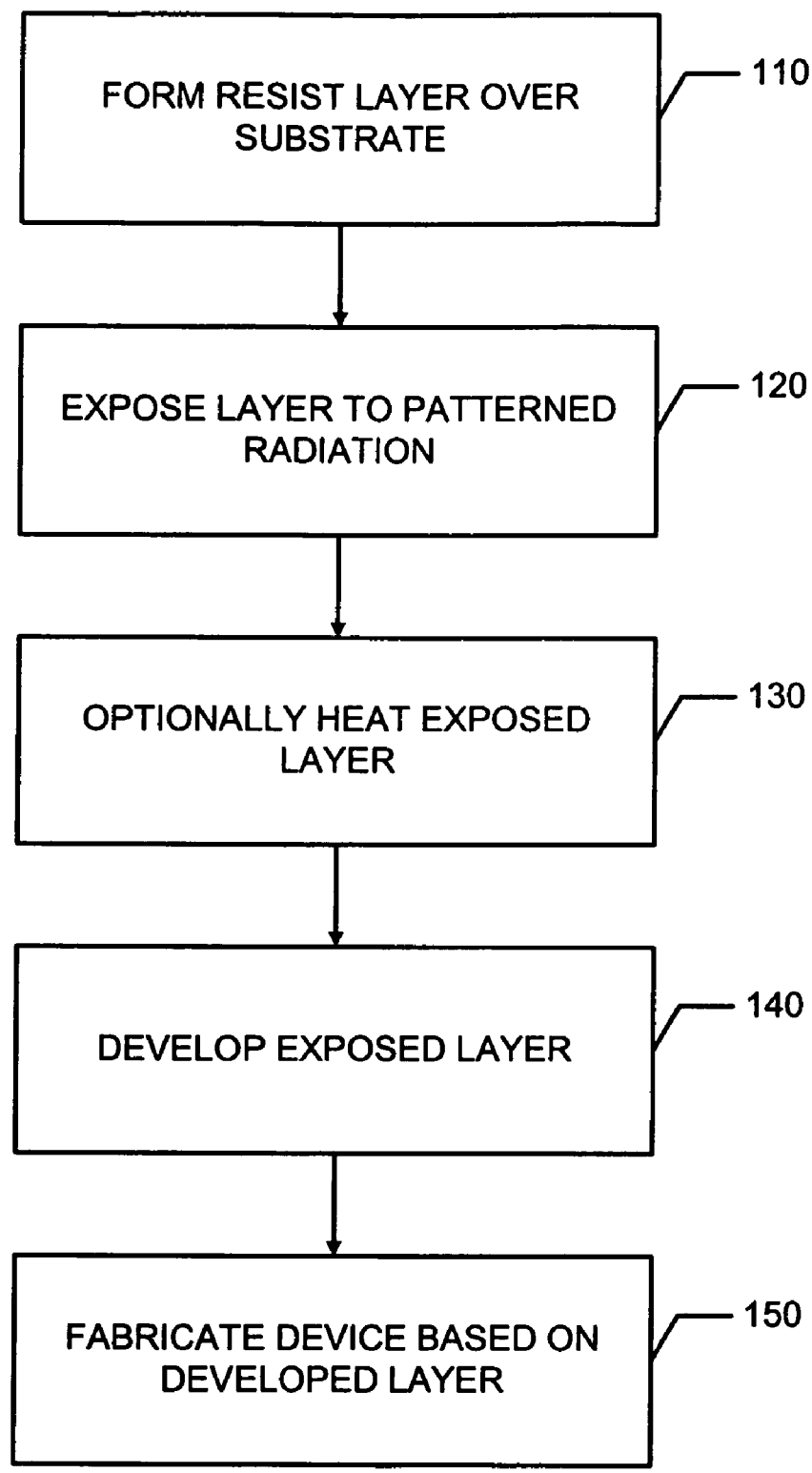
FIG. 1 shows an exemplary method of fabricating a device having miniature components, according to one embodiment of the invention.

In the following description, numerous specific details are set forth. However, it is understood that embodiments of the invention may be practiced without these specific details. In other instances, well-known structures, formulas, and techniques have not been shown in detail in order not to obscure the understanding of this description.

I. Introduction

Chemically amplified resists are currently in widespread use in the manufacture of micro-electronic devices, micro-mechanical devices, micro-electromechanical devices (e.g., micro-electromechanical systems (MEMS)), micro-optical devices, and other devices having miniature components. This may be due at least in part to the good exposure sensitivity that chemical amplification tends to provide. In one aspect, chemical amplification may involve using radiation to generate species, such as acid catalysts, that may promote subsequent chemical transformation of the resist in order to alter the solubility of the resist in a developer.

A common imaging mechanism used in positive-type chemically amplified resists is known in the arts as deprotection or deblocking. In a representative example of deprotection, a base-soluble functionality, such as a carboxylic acid group, may be protected by an acid-labile protecting group. The protection of the acid group may result in a significant decrease in the dissolution rate of the polymer in an alkaline water-based developer.

A radiation-induced deprotection reaction may be employed to cleave or otherwise detach the acid labile protecting group and significantly increase the dissolution rate of the polymer in the alkaline water-based developer. Generally, the resist may be exposed to radiation, for example in lithography, in order to generate a deprotection reaction promoter, such as an acid. The acid may catalyze a deprotection reaction in which the acid labile protecting group is cleaved from the polymeric chain. This may deprotect the carboxylic acid group, or other base-soluble functionality, which may tend to promote dissolution of the polymer in alkaline water-based developer. In this way, the exposed areas of the resist, having the radiation-generated acid catalyst, may be dissolved in the alkaline water-based developer and removed. This may allow positive images or patterns to be formed.

II. Exemplary Resist Compounds

An exemplary resist compound, according to one embodiment of the invention, may have the following chemical formula:

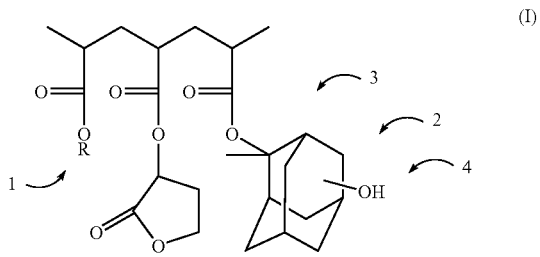

(I)

The resist compound includes a polymeric chain 1, an acid labile protecting group 2 attached to the polymeric chain at a linkage 3, and a hydrophilic group 4 attached to the acid labile protecting group.

The term "protecting group" generally refers to a group, or other portion of a compound, that may protect or block a functional group of the polymeric chain, such as a carboxylic acid group, to reduce its participation in a reaction, such as an acid-base reaction. In the case of a positive type chemically amplified resist based on deprotection, the protection of the carboxylic acid group, or other base-soluble functionality, may tend to inhibit or at least reduce the rate of dissolution of the resist compound in a developer, such as an aqueous alkaline developer solution. Thus, in at least one aspect, the protecting group may be considered a "dissolution inhibitor" to at least inhibit dissolution of the polymeric chain in an alkaline water-based developer by protecting or blocking the acidic base-soluble functionality. The term "acid labile" generally implies that the group is capable of being changed, such as cleaved or otherwise detached from the chain, by an acid.

The illustrated protecting group includes a methyl adamantyl ester. The methyl adamantyl group is bonded to an acyl group of the polymeric chain at an ester linkage. The methyl adamantyl ester is an example of a bulky organic group. In particular the methyl adamantyl ester is an example of an alicyclic group. An alicyclic group generally includes a ring that is not aromatic. Alicyclic moieties may include monocyclic rings and polycyclic rings. Methyl adamantyl ester includes a polycyclic ring, which is also occasionally known in the arts as a "cage". Methyl adamantyl ester will continue to be used to illustrate certain concepts, although as will be explained further below, other embodiments of the invention are not limited to the use of methyl adamantyl ester, and a wide variety of other acid labile protecting groups may alternatively be employed.

In the presence of an acid, which may be generated by exposing a photoacid generator (PAG) or other radiation-sensitive acid generator to radiation, for example, the acid labile protecting group may be cleaved or otherwise detached from the polymeric chain through the following exemplary deprotection reaction:

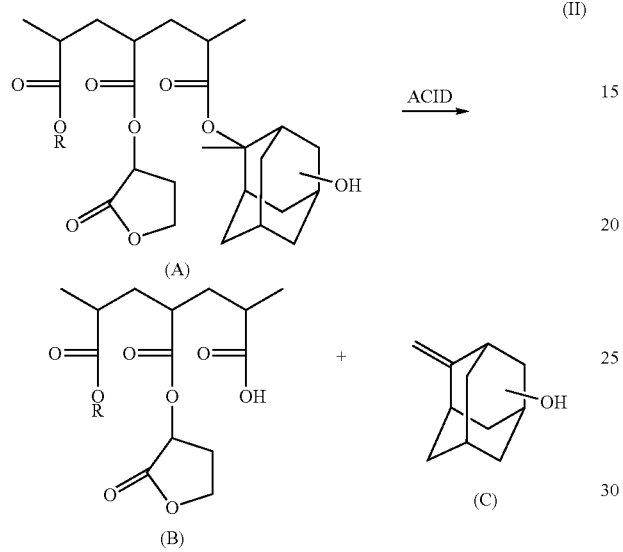

In this reaction, the acid labile protecting group or dissolution inhibitor is detached from the polymeric chain of the reactant resist compound (A) by cleavage of the ester linkage. The products of the reaction include a base-soluble polymeric chain (B), which includes a carboxylic acid group, as a base-soluble functionality, at the point of detachment of the protecting group, and a detached deprotecting group (C), which in this case includes a hydroxylated methylene adamantane.

The detachment of the protecting group generally increases the solubility of the polymeric chain in alkaline water-based developers. This may be due at least in part to the production of the carboxylic acid group, which is an exemplary base-soluble functionality. In the alkaline developer, the carboxylic acid group may react to form a carboxylate salt, which tends to promote solubility in water.

As shown, in an embodiment of the invention, at least one hydrophilic group may be attached to the acid labile protecting group. The term "hydrophilic group" generally refers to a group that has a greater affinity for water than for a relatively non-polar organic solvent, such as n-hexane. In one aspect, a hydrophilic group may include a group with a greater affinity for water than a methyl group (—CH$_3$), which is an example of a mildly hydrophobic group. In another aspect, a hydrophilic group may include a group with a greater affinity for water than hydrogen (—H). Exemplary hydrophilic groups with a greater affinity for water than methyl and hydrogen include, but are not limited to, hydroxyl (—OH) and sulfhydryl (—SH). Of these, hydroxyl tends to be the more hydrophilic.

In the illustrated embodiment, a single hydroxyl group is attached to the methyl adamantyl ester. The hydroxyl group is a highly hydrophilic group that when attached to a protecting group may help to increase the solubility of the detached deprotecting group in water-based developers and other polar solutions. This may tend to reduce the formation of particles, scum, residue, and other remnants that may potentially contribute to decreased manufacturing yields.

The generalized attachment of the hydroxyl group to the protecting group is used to indicate that the hydroxyl group may be attached to various carbon atoms of the alicyclic group of the methyl adamantyl ester. In one aspect, the hydroxyl group may be attached at any of the carbon atoms of the alicyclic group of the methyl adamantyl ester except for at the methyl position.

According to various embodiments of the invention, the following chemical formulas illustrate specific examples of locations where the hydroxyl group (—OH) may be attached (where RCO— is used to represent the polymeric chain and acyl group):

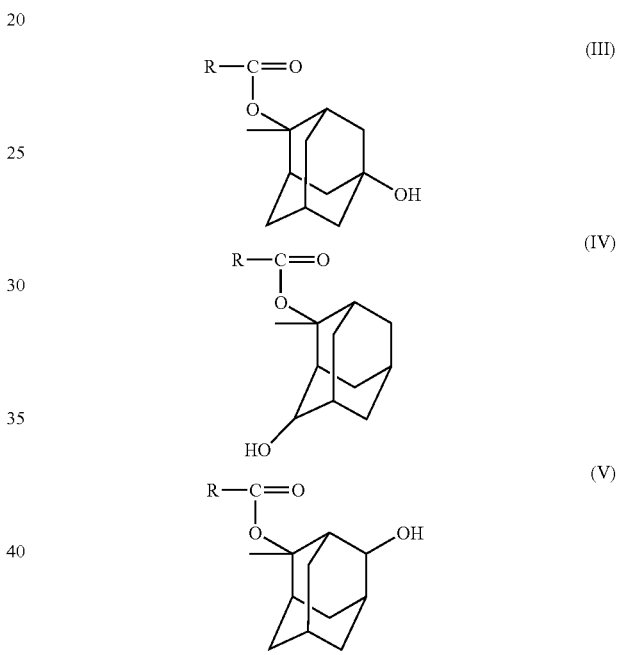

Other locations where the hydroxyl group may be attached are contemplated and will be apparent to those skilled in the art and having the benefit of the present disclosure.

According to another embodiment of the invention, a plurality of two or more hydroxyl groups may be attached to the alicyclic group of the methyl adamantyl ester. In various illustrative embodiments of the invention, specific examples of locations where the hydroxyl group may be attached are given in the following chemical formulas:

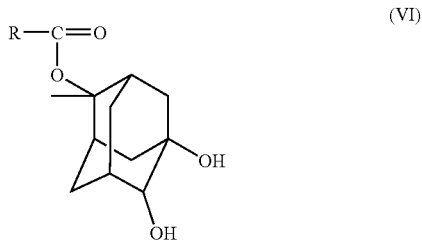

-continued

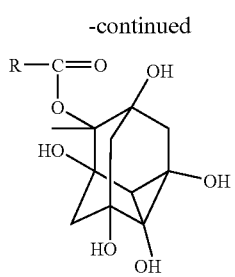
(VII)

Other hydrophilic groups that are also potentially suitable include, but are not limited to, sulfhydryl (—SH). As one specific example, in an embodiment of the invention, a sulfhydryl group (—SH) may be attached to an alicyclic group of a methyl adamantyl ester as given in the following chemical formula:

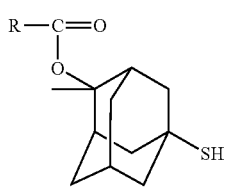
(VIII)

Other embodiments employing a different hydrophilic group, or a plurality of potentially different hydrophilic groups, will be apparent to those of skill in the art and having the benefit of the present disclosure.

As previously discussed, the use of the particular illustrated methyl adamantyl ester is not required. Other alkyl adamantyl esters having, for example, from about one to five carbon atoms, may be employed. Additionally, one or more hydrogen of the adamantyl may be replaced with a halogen, such as fluorine. The fluorine may help to improve transparency at 193 nm. Additionally, a wide variety of other acid labile protecting groups may also optionally be employed. Suitable acid labile protecting groups include, but are not limited to, bulky organic esters, such as branched alkyl esters, or alicyclic esters. Suitable branched alkyl esters include, but are not limited to, branched alkyl esters having, for example, from about six to twenty carbon atoms (i.e., branched $C_{6-20}$ alkyl esters). Relatively lower molecular weight alkyl esters having less than about six carbon atoms tend to evaporate after detachment.

Suitable alicyclic esters, in addition to potentially halogenated alkyl adamantyl esters, include monocyclic ring esters, and other polycyclic ring or cage esters. Exemplary monocyclic ring esters include, but are not limited to, alkyl cyclopentyl esters and alkyl cyclohexyl esters, where the alkyl groups include short straight or branched alkyl groups having from about one to six carbon atoms (i.e., $C_{1-6}$ alkyl). Specific examples include, but are not limited to, methyl cyclopentyl ester, ethyl cyclopentyl ester, n-propyl cyclopentyl ester, iso-propyl cyclopentyl ester, t-butyl cyclopentyl ester, n-pentyl-cyclopentyl ester, methyl cyclohexyl ester, ethyl cyclohexyl ester, n-propyl cyclohexyl ester, iso-propyl cyclohexyl ester, t-butyl cyclohexyl ester, and n-pentyl cyclohexyl ester.

Suitable polycyclic ring or cage esters include, but are not limited to, alkyl isobornyl, and alkyl norbornyl, where the alkyl groups include short-chain straight or branched alkyl groups having, for example, from about one to five carbon atoms (i.e., $C_{1-5}$ alkyl). An exemplary short-chain alkyl-substituted cage includes methyl adamantyl.

In various embodiments of the invention, at least one hydrophilic group, such as at least one hydroxyl group, may be attached to any one of the above-identified acid labile protecting groups. As one specific example, in an embodiment of the invention, a hydroxyl group may be attached to a methyl cyclohexyl ester as given in the following chemical formula:

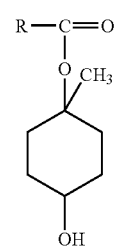
(IX)

As another specific example, in an embodiment of the invention, a hydroxyl group may be attached to a norbornyl ester as given in the following chemical formula:

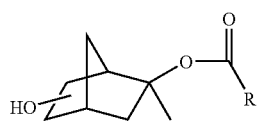
(X)

Other embodiments employing at least one or a plurality of potentially different hydrophilic groups will be apparent to those skilled in the art and having the benefit of the present disclosure.

Now the polymeric chain will be discussed in greater detail. Referring again to chemical formula (I), the illustrated polymeric chain includes a generalized representation of a (meth)acrylate chain, which is a commonly used platform in 193 nanometer (nm) lithography. The polymeric chain is substantially aliphatic, rather than aromatic. Aromatic chains, such as those employed in 248 nm UV lithography, which will be discussed further below, tend to absorb 193 nm radiation. In contrast, the illustrated aliphatic chain tends to be sufficiently transparent to 193 nm radiation.

The generalized representation encompasses a variety of (meth)acrylate chains known in the arts. Referring to chemical formula (I), suitable groups for R include, but are not limited to, non-aromatic groups, such as hydrogen, straight or branched alkyl groups having, for example, from about one to ten carbon atoms (i.e., $C_{1-10}$ alkyl), and non-aromatic rings, such as alicyclic group. The alicyclic group may include a monocyclic ring, such as cyclopentane or cyclohexane. Alternatively, the alicyclic group may include a polycyclic ring or cage, such as adamantyl or norbornyl.

Other polymeric chains may also optionally be employed in 193 nm lithography. Examples include, but are not limited to, functionalized poly(cycloolefins) containing carboxylic acid groups, alicyclic-modified methacrylates, cyclic olefin maleic anhydrides, polymers of functionalized norbornene copolymerized with maleic anhydride, terpolymers of methacrylic acid, t-butyl methacrylate, and methyl methacrylate, polynorbornene incorporating carboxylic acids.

At present, 193 nm lithography is widely used in the fabrication of transistors, MEMS, and other devices having relatively small feature sizes. A smaller wavelength tends to allow fabricating smaller feature sizes with greater resolution. Also, generally the smaller the feature size the more significant the contribution of non-dissolved deprotecting groups to decreased manufacturing yields. As one example, when forming microelectronic devices with smaller contact/ via holes, increasingly smaller amounts of developer tend to reach the bottom of the holes, making it difficult to sufficiently remove the detached deprotecting groups located near the bottom of the holes. Accordingly, the attached hydrophilic groups are contemplated to be useful in reducing the formation defects in 193 nm and shorter-wavelength implementations.

However, other embodiments of the invention are not limited to 193 nm lithography but are more generally applicable to other actinic radiations that are capable of producing photochemical change in chemical substances, such as resists. In particular, embodiments of the invention are applicable to deep ultraviolet (DUV) radiations having a wavelength that is less than about 250 nm, and extreme ultraviolet (EUV) radiations having a wavelength that is less than about 180 nm. Specific examples of other suitable actinic radiations include, but are not limited to, those with wavelengths of about 248 nm, and 13.5 nm.

Various positive chemically amplified polymers based on dissolution inhibition imaging mechanisms that are suitable for lithography at 248 nm, and 13.5 nm wavelengths are known in the arts. For example, polyhydroxystyrene (PHS) may be employed in 248 nm and 13.5 nm lithography. Polymers suitable for other wavelengths, such as 157 nm, are also known in the arts.

In one embodiment of the invention, at least one hydrophilic group, such as a hydroxyl group, may be attached to an acid labile protecting group that is attached to one of these above-described polymeric chains. For example, according to one embodiment of the invention, a resist compound including a PHS chain may have the following chemical formula:

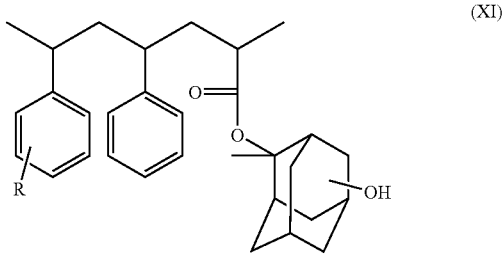

(XI)

In this formula, suitable R include, but are not limited to, hydrogen, hydroxyl, straight or branched alkyl groups having, for example, from about one to ten carbon atoms (i.e., $C_{1-10}$ alkyl), or alicyclic groups, such as cages. A methyl adamantyl ester having an attached hydroxyl group is employed as an acid labile or cleavable protecting group. In other embodiments, different locations of attachment of one or more potentially different hydrophilic groups may be employed.

III. Exemplary Resist Compositions

In one embodiment of the invention, the resist compounds disclosed herein may be included in a resist composition with one or more other ingredients. Suitable ingredients include, but are not limited to, radiation-sensitive species that are capable of generating acids if exposed to radiation, acid scavengers, surfactants, sensitizers, stabilizers, and dyes.

Suitable radiation-sensitive acid generators that are capable of generating an acid if exposed to radiation include, but are not limited to, iodonium salts, sulfonium salts, and other onium salts; bis(alkylsulfonyl) diazomethanes, bis (cycloalkylsulfonyl) diazomethanes, bis(arylsulfonyl) diazomethanes, and other diazomethanes; oxime sulfonates, nitrobenzylsulfonates, iminosulfonates, disulfones, and organic halogen compounds. Exemplary diazomethanes include, but are not limited to, bis(n-propylsulfonyl)diazomethane, bis(isopropylsulfonyl)diazomethane, bis(n-butylsulfonyl)-diazomethane, bis(isobutylsulfonyl)-diazomethane, bis(tert-butylsulfonyl)diazomethane, and other bis(alkylsulfonyl)diazomethanes each having a straight- or branched-chain alkyl group. Other exemplary diazomethanes include, but are not limited to, bis(cyclopentylsulfonyl)diazomethane, bis(cyclohexylsulfonyl) diazomethane, and other bis(cycloalkylsulfonyl)diazomethanes each having a cyclic alkyl group. Still other exemplary diazomethanes include, but are not limited to, bis(phenylsulfonyl)diazomethane, bis(p-methyphenylsulfonyl)diazomethane, bis(2,4-dimethylphenylsulfonyl)diazomethane, bis(p-methoxyphenylsulfonyl)diazomethane, and other bis (arylsulfonyl)diazomethanes each having a substituted or un-substituted phenyl group. These radiation-sensitive acid generators are also known in the arts as photoacid generators. According to various embodiments of the invention, the radiation-sensitive acid generators may be employed in the resist composition at a concentration of from about 0.1 to 20 weight percent (wt %), 0.5 to 15 wt %, or 1 to 10 wt %.

Some practitioners may find it appropriate to include one or more acid scavengers in the composition. The acid scavengers, which are optional, may tend to improve resolution by adjusting or limiting the diffusion or mobility of the acid. Suitable acid scavengers include, but are not limited to, nitrogen-containing compounds, such as amines, and other basic compounds. Exemplary amines include, but are not limited to, tri-n-butylamine, triethanolamine, and tris(2-methoxyethyl)amine. According to various embodiments of the invention, the acid scavengers may be employed at concentrations of from about 0 to 10 wt %, 0 to 5 wt %, or 0 to 1 wt %.

Some practitioners may find it appropriate to include one or more surfactants in the composition. The surfactants, which are optional, may tend to help improve the wetability of the resist, for example during immersion lithography, development, or both. However, it is contemplated that at least a portion of the surfactants may, at least potentially, contribute to scum. In one aspect, the attachment of the hydroxyl or other hydrophilic group to the protecting group may be useful to reduce the amount of surfactant. In one embodiment of the invention, exposing the layer to the radiation may include wetting the hydrophilic group of the detached group with an immersion lithography fluid. In one embodiment of the invention, wetting the hydrophilic group with the fluid may include forming a hydrogen bond between a hydroxyl group and the fluid. In various aspects, the surfactants may be employed at concentrations of from about 0 to 10 wt %, 0 to 5 wt %, or 0 to 1 wt %.

Some practitioners may find it appropriate to include one or more sensitizers, stabilizers, or dyes in the composition. These components, which are optional, are often included at concentrations of less than about 5 wt %.

To further illustrate, consider several exemplary resist compositions. A resist composition (on a solvent-dry basis), according to one embodiment of the invention, may have the components and concentrations listed in Table 1.

TABLE 1

| Ingredient | Weight Percent (wt %) |
|---|---|
| Resist Compound | 80–99.9 |
| Photoacid Generator | 0.1–20 |
| Acid Scavenger | 0–10 |
| Surfactant | 0–10 |
| Sensitizer | 0–5 |
| Stabilizer | 0–5 |
| Dye | 0–5 |

Another resist composition (on a solvent-dry basis), according to one embodiment of the invention, may have the components and concentrations listed in Table 2.

TABLE 2

| Ingredient | Weight Percent (wt %) |
|---|---|
| Resist Compound | 85–99.5 |
| Photoacid Generator | 0.5–15 |
| Acid Scavenger | 0–5 |
| Surfactant | 0–5 |
| Sensitizer | 0–5 |
| Stabilizer | 0–5 |
| Dye | 0–5 |

Yet another resist composition (on a solvent-dry basis), according to one embodiment of the invention, may have the components and concentrations listed in Table 3.

TABLE 3

| Ingredient | Weight Percent (wt %) |
|---|---|
| Resist Compound | 90–99 |
| Photoacid Generator | 1–10 |
| Acid Scavenger | 0–1 |
| Surfactant | 0–1 |
| Sensitizer | 0–5 |
| Stabilizer | 0–5 |
| Dye | 0–5 |

Typically, a solvent may be used to dilute the previously described resist compositions prior to use. For example, a composition of about 80 wt % solvent may be used. In one aspect, this may facilitate application of a smooth and uniform layer. A wide variety of organic solvents may potentially be employed. Depending upon the particular implementation, suitable solvents include, but are not limited to, ether solvents (e.g., ethylene glycol, dipropylene glycol, and propylene glycol methyl ether acetate), ester solvents (e.g., methyl lactate, ethyl acetate, and γ-butyrolactone), ketone solvents (e.g., acetone, methyl isobutyl ketone, and 2-heptanone), and combinations thereof. The solvent is often added prior to shipping to the point of use, although this is not required. Accordingly, other exemplary resist compositions include those given in Tables 1–3 but diluted to about 20 wt % by a solvent.

IV. Exemplary Method of Fabricating Devices Using Resists

FIG. 1 is a block flow diagram of a method 100 of forming a device based on exposure and development of a resist layer, according to one embodiment of the invention. The method includes forming a resist layer over a substrate, at block 110.

The term substrate generally refers to the physical object that is the basic workpiece of which at least a portion is transformed by process operations into the device. Embodiments of the invention are not limited to any known substrate. In one aspect, the substrate may include a wafer. The wafer may include semiconducting, non-semiconducting, or combinations of semiconducting and non-semiconducting materials. In another aspect, the substrate may include metal, plastic, quartz, glass, or other material of which the device is to be fabricated. For example, the substrate may include a plastic from which a micro-mechanical device is to be formed. As another example, the substrate may include a chrome-on-quartz substrate, which may be patterned to form a lithography mask.

In forming the layer over the substrate, at block 110, spin coating, spray coating, roll coating, dip coating, painting, or other application methods known in the arts may optionally be employed to apply a resist composition over or on the substrate. In one aspect, the resist composition may include a resist compound as disclosed elsewhere herein, a radiation-sensitive acid generator capable of generating an acid if exposed to radiation, and optionally one or more solvents, acid scavengers, surfactants, sensitizers, stabilizers, and dyes.

Forming the resist layer over the substrate may further optionally include, after applying the layer, heating or otherwise thermally treating the layer. Depending upon the particular resist composition, this may be used to dry the layer, evaporate solvents, improve contact with the substrate, or otherwise prepare the layer for subsequent processing.

Then, after any optional thermal treatment, the resist layer may be exposed to patterned radiation, at block 120. In a representative example, a radiation source, such as a lamp or laser, may generate and transmit radiation to the radiation-sensitive layer through a patterned mask, which may pattern the radiation. In one aspect, the radiation may include actinic radiation. Suitable actinic radiations include, but are not limited, deep ultraviolet (DUV) having a wavelength of less than about 250 nm, and extreme ultraviolet (EUV) having a wavelength of less than about 180 nm. Specific examples include those having wavelengths of about 248 nm, 193 nm, and 13.5 nm. In one embodiment of the invention, an immersion lithography exposure tool may be used. The radiation may cause the radiation-sensitive acid generator to generate an acid. Without limitation, the acid generator may undergo photolysis, decomposition, dissociation, or other chemical change, depending upon the particular species, in order to generate the acid.

Then, the exposed layer may optionally be heated or otherwise thermally treated, at block 130. This is often known in the lithography arts as a post-exposure bake. The thermal treatment may complete an acid-catalyzed deprotection reaction in which the acid labile protecting group having the hydrophilic group attached thereto may be cleaved or otherwise detached from the polymeric chain.

Next, after any optional thermal treatment, the layer may be developed, at block 140. Development is also occasionally known in the arts as resist strip. During development, the exposed layer may be contacted with a developer. In one aspect, the developer may include an alkaline water-based solution or other alkaline polar solvent. Suitable alkaline water-based developer solutions include, but are not limited to, aqueous solutions of bases, such as ammonium, dimethylaminomethanol, hydroxylamine, potassium carbonate, potassium hydroxide, sodium carbonate, sodium hydroxide, tetramethylammonium hydroxide (TMAH), (2-hydroxyethyl) trimethylammonium hydroxide (also known as colline), triethylamine, and trimethylhydroxylethylammonium hydroxide.

In developing the layer, the polymeric chains and detached deprotecting groups in the exposed portions of the resist may be dissolved in the developer. The attachment of the hydrophilic group to the acid labile protecting group may help to increase the solubility of the detached deprotecting group in the developer. In one aspect, the hydrophilic group attached to the detached deprotecting group may be wetted with water or another polar component of the developer. When the hydrophilic group includes a hydroxyl group, hydrogen bonds may potentially be formed between water and the hydroxyl group. Then, the developer may be removed, along with the dissolved portions of the layer.

After development, conventional processing may be used to fabricate the device based on the patterned layer, at block 150. In one embodiment of the invention, the device may include a device having miniature components. For example, the device may include a micro-electronic device having miniature electronic circuits (e.g., a microprocessor), micro-mechanical device having miniature mechanical structures, micro-electromechanical devices (e.g., micro-electromechanical systems (MEMS)), or micro-optical device. In another embodiment of the invention, the device may include a lithography mask. Other embodiments of the invention are not so limited. In the case of many devices including miniature components, the conventional processing may include one or more of such well-known operations as etching, doping, diffusion, dielectric deposition, metallization, passivation, electrical test, and assembly. Conventional methods, equipment, and materials may optionally be employed.

V. EXAMPLES

Having been generally described, the following examples are given as particular embodiments of the invention, to illustrate some of the properties and demonstrate the practical advantages thereof, and to allow one skilled in the art to utilize embodiments of the invention. It is understood that these examples are to be construed as merely illustrative.

Example 1

Synthesizing Exemplary Resist Compound

This prophetic example shows how to make a compound having the acid-labile group as shown in chemical formula (III) attached to a methacrylate polymer as shown in chemical formula (I). In this synthesis, 5-hydroxy-2-adamantanone (CAS No. 20098-14-0, Sigma-Aldrich) may be used as a starting material. In a first stage, the 5-Hydroxy-2-adamantanone may converted to a tertiary alcohol using a standard Grignard reaction, with methylmagnesium-chloride ($CH_3MgCl$, CAS No. 676-58-4, Sigma-Aldrich) as the Grignard reagent. The reaction may be carried out in methylene chloride at about room temperature (23° C.). In a second stage, the product alcohol may be reacted with acryloyl chloride (CAS No. 814-68-6, Sigma-Aldrich) in an esterification reaction. The acryloyl chloride may be added dropwise to a stirred solution of the equimolar product alcohol (from the first stage), along with excess triethylamine, and methylene chloride. The reaction may be conducted under a dry nitrogen atmosphere at a cooled temperature of about 0° C. The reaction mixture may be stirred for about three hours at the cooled temperature. Then, the resultant mixture may be filtered, and the filtrate may be concentrated in a vacuum. The concentrated mixture may be washed with water and brine. The water layer may be extracted with methylene chloride. The organic layer and the extracts may be combined, dried with anhydrous sodium sulfate, and concentrated in a vacuum. Then, the product monomer may be purified by silica gel chromatography. In a third stage, the polymer may be synthesized by reacting the monomer (from the second stage) with a standard methacrylate monomer in a free-radical polymerization reaction with azobisisobutyronitrile (AIBN, CAS No. 78-67-1, Sigma-Aldrich) as catalyst. The resultant polymer may be washed with a mixture of ethyl acetate and hexane in order to precipitate out the polymer. Those skilled in the art and having the benefit of the present disclosure will appreciate that other compounds disclosed herein may be synthesized, without undue experimentation, by a similar procedure, but by substituting different commercially available ketones for the 5-hydroxy-2-adamantanone.

Example 2

Synthesizing Other Exemplary Resist Compounds

This prophetic example shows how to make a compound having the acid-labile group as shown in chemical formula (IX) attached to a (meth)acrylate polymer as shown in chemical formula (I). The compound may be synthesized according to the procedure of Example 1 by substituting 4-hydroxy-cyclohexanone for the 5-Hydroxy-2-adamantanone.

Example 3

Using Resist Composition for Lithography

This prophetic example shows how to use a resist composition as disclosed herein in lithography. The resist composition may be spin coated on a silicon substrate with a spin rate of about 1000 to 3000 rpm for about 10 to 90 seconds. The coated substrate may be pre-baked by heating to a temperature of about 100 to 180° C. for about 30 to 90 seconds. The thickness of the layer may be from about 100 to 500 nm. The layer may be exposed to 193 nm radiation using a Nikon S30x (where x=5, 6, or 7) exposure tool, available from Nikon, of Kumagaya, Japan. Another suitable exposure tool is an ASML 1250. The exposed layer may then be post exposure baked by heating to a temperature of about 100 to 190° C. for about 30 to 90 seconds on a hot plate. Then, the baked, exposed layer may be developed by contacting the layer with an aqueous solution of 1 to 4 wt % TMAH. Next, the developed layer may be washed with deionized water, and spin-dried.

VI. Other Matters

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

In the description above, for the purposes of explanation, numerous specific details have been set forth in order to provide a thorough understanding of the embodiments of the invention. It will be apparent, however, to one skilled in the art, that other embodiments may be practiced without some of these specific details. In other instances, well-known structures, formulas, devices, and techniques have been shown in block diagram form or without detail in order not to obscure the understanding of this description.

Many of the methods are described in their most basic form, but operations may be added to or deleted from the methods. It will be apparent to those skilled in the art that many further modifications and adaptations may be made. The particular embodiments are not provided to limit the invention but to illustrate it. The scope of the invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that a claim require more features than are expressly recited therein. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

In the claims, any element that does not explicitly state "means for" performing a specified function, or "step for" performing a specified function, is not to be interpreted as a "means" or "step" clause as specified in 35 U.S.C. Section 112, Paragraph 6. In particular, any use of "step of" in the claims herein is not intended to invoke the provisions of 35 U.S.C. Section 112, Paragraph 6.

What is claimed is:

1. A compound comprising:
a polymeric chain;
an acid labile group attached to the polymeric chain; and
at least one hydrophilic group attached to the acid labile group,
wherein the at least one hydrophilic group comprises a sulfhydryl group.

2. The compound of claim 1, wherein the at least one hydrophilic group comprises a hydroxyl group.

3. The compound of claim 1, wherein the at least one hydrophilic group comprises a plurality of hydrophilic groups.

4. The compound of claim 1, wherein the acid labile group comprises an organic group having the sulfhydryl group attached thereto.

5. The compound of claim 4, wherein the organic group comprises an alicyclic group.

6. The compound of claim 5, wherein the alicyclic group comprises a ring selected from a monocyclic ring and a polycyclic ring.

7. The compound of claim 5, wherein the alicyclic group comprises a group selected from cyclopentyl, cyclohexyl, adamantyl, and norbornyl.

8. The compound of claim 5, wherein the alicyclic group comprises methyl adamantyl.

9. The compound of claim 1, wherein the polymeric chain comprises a (meth)acrylate chain.

10. A composition comprising:
the compound of claim 1; and
a radiation sensitive acid generator capable of generating an acid if exposed to radiation.

11. A method comprising:
applying a layer of the composition of claim 10 over a substrate;
heating the applied layer;
after said heating the layer, exposing the layer to patterned radiation by transmitting actinic radiation to the layer through a patterned mask;
heating the exposed layer; and
after said heating the exposed layer, developing the exposed layer by contacting the exposed layer with a developer and then removing the developer.

12. A compound comprising:
a polymeric chain;
a dissolution inhibitor attached to the polymeric chain to inhibit dissolution of the polymeric chain in a developer; and
at least one hydrophilic group attached to the dissolution inhibitor,
wherein the at least one hydrophilic group comprises a sulfhydryl group.

13. The compound of claim 12, wherein the at least one hydrophilic group comprises a hydroxyl group.

14. The compound of claim 12, wherein the dissolution inhibitor comprises an alicyclic group.

15. The compound of claim 14, wherein the alicyclic group comprises a ring selected from a monocyclic ring and a polycyclic ring.

16. The compound of claim 15, wherein the alicyclic group comprises one selected from cyclopentyl, cyclohexyl, adamantyl, and a group including norbornyl.

17. A composition comprising:
the compound of claim 12; and
a radiation sensitive acid generator capable of generating an acid if exposed to radiation.

18. A method comprising:
applying a layer of the composition of claim 17 over a substrate;
heating the applied layer;
after said heating the layer, exposing the layer to patterned radiation by transmitting actinic radiation to the layer through a patterned mask;
heating the exposed layer; and
after said heating the exposed layer, developing the exposed layer by contacting the exposed layer with a developer and then removing the developer.

* * * * *